(12) United States Patent
Tandon et al.

(10) Patent No.: US 8,218,377 B2
(45) Date of Patent: Jul. 10, 2012

(54) FAIL-SAFE HIGH SPEED LEVEL SHIFTER FOR WIDE SUPPLY VOLTAGE RANGE

(75) Inventors: Amit Tandon, Delhi (IN); Promod Kumar, Uttar Pradesh (IN); Abhishek Lal, Faridabad (IN)

(73) Assignee: STMicroelectronics Pvt. Ltd., Greater Noida, IN (US)

( * ) Notice: Subject to any disclaimer, the term of this patent is extended or adjusted under 35 U.S.C. 154(b) by 234 days.

(21) Appl. No.: 12/464,749

(22) Filed: May 12, 2009

(65) Prior Publication Data
US 2010/0061164 A1    Mar. 11, 2010

(30) Foreign Application Priority Data
May 19, 2008    (IN) .......................... 1291/DEL/2008

(51) Int. Cl.
*G11C 7/00* (2006.01)
(52) U.S. Cl. .. 365/189.11; 365/78; 365/80; 365/189.12; 365/240; 327/333

(58) Field of Classification Search ............. 365/189.11, 365/189.12, 230.06, 240, 78, 80; 327/333
See application file for complete search history.

(56) References Cited

U.S. PATENT DOCUMENTS

| | | | |
|---|---|---|---|
| 5,828,607 A * | 10/1998 | Bushey et al. | ........... 365/189.11 |
| 7,835,200 B2 * | 11/2010 | Zhang | ...................... 365/189.09 |
| 2005/0275445 A1 * | 12/2005 | Johansson et al. | ............ 327/333 |

* cited by examiner

*Primary Examiner* — Pho M Luu
*Assistant Examiner* — Thao Bui
(74) *Attorney, Agent, or Firm* — Gardere Wynne Sewell LLP

(57) ABSTRACT

A fail-safe level shifter switching with high speed and operational for a wide range of voltage supply includes a cascode module, and one or more speed enhancer modules. The cascode module receives one or more input logic signal for generating a plurality of output signals with a reduced switching time. The speed enhancer modules are coupled to the cascode module for facilitating faster charging and discharging of nodes of the cascode module and improving the robustness and operating voltage range of cascode module.

25 Claims, 12 Drawing Sheets

FAIL-SAFE HIGH SPEED LEVEL SHIFTER FOR WIDE SUPPLY VOLTAGE RANGE

TECHNICAL FIELD

The present invention relates to integrated circuits, and more specifically to a fail-safe level shifting circuit switching with high speed and operating over a wide range of supply voltage.

BACKGROUND

Devices such as flash memories, EEPROMs (Electrically Erasable Programmable Read Only Memories), etc., require high positive and negative voltages for modify operations (program and erase). In order to manage these high voltages, control signals of similar voltage levels are required. These control signals are generated through level shifter circuits that receive a logic level signal as an input and generate a corresponding high voltage signal as an output. A positive level shifter is a circuit that shifts the logic level input signal into corresponding higher voltage positive voltage level signals and a negative level shifter circuit shifts the logic level input signal into corresponding negative voltage level signals.

FIG. 1 illustrates a circuit diagram of a conventional high-voltage cascode switching module based negative level shifter 100. The negative level shifter 100 shifts logic level signals to generate corresponding negative voltage signals. It includes a plurality of PMOS transistors 102, 104, 106, 108, a plurality of NMOS transistors 110, 112, cross coupled PMOS transistors 114, 116, and cross coupled NMOS transistors 118, 120. The input signal is a logic level signal IN for which logic '1' corresponds to VDD and logic '0' corresponds to zero. The negative level shifter 100 generates four output signals at nodes OUTH, OUTHN, OUT and OUTN. Among these, the output signals at the nodes OUTH and OUTHN are complementary signals switching over the full range of voltage supplies (i.e., switching between VDD and VNEG) whereas the output signals at the nodes OUT and OUTN switch between zero and VNEG.

Voltage levels of the four output signals at the output nodes OUT, OUTN, OUTH and OUTHN for different values of the logic level input signal IN are summarized in TABLE 1.

TABLE 1

| INPUT | OUTPUT | | | |
|---|---|---|---|---|
| IN | OUT | OUTN | OUTH | OUTHN |
| 1 | 0 | VNEG | VDD | VNEG |
| 0 | VNEG | 0 | VNEG | VDD |

To understand the operation of the negative level shifter circuit 100, consider an initial state at time t=0, when the input signal IN=1 (VDD), OUTH=VDD, OUT=0, OUTHN=VNEG and OUTN=VNEG. As the input signal IN is switched from 1 to 0, PMOS transistor 102 is switched ON, resulting in charging of the first output node OUTHN (initially charged to VNEG) to the supply voltage VDD and subsequent charging of the third output node OUTN (initially charged to VNEG) to a voltage −Vtn (where Vtn corresponds to the threshold voltage of the NMOS transistor) through NMOS transistor 110. At this time, NMOS transistor 120 is experiencing a gate-source voltage Vgs of −Vtn−VNEG (absolute value of |VNEG|−|Vtn|), and is trying to force a VNEG voltage at fourth output node OUT. At the same time, PMOS transistor 116 is experiencing a gate-source voltage Vgs of −Vtn, and is trying to force a zero voltage at the fourth output node OUT. If Vtn>=Vtp (where Vtp corresponds to the threshold voltage of the PMOS transistor). As a result, a conflict develops between PMOS transistor 116 and NMOS transistor 120. With appropriate sizing of transistors 116 and 120, the NMOS transistor 120 is made to over-ride PMOS transistor 116 and drive voltage VNEG on the fourth output node OUT and subsequently on the second output node OUTH. As node OUT is discharged to VNEG, it eventually charges node OUTN to 0 through PMOS 116.

Limitations of the Conventional Architecture

1 High Switching Time and Switching Currents:

At the time of switching, NMOS 120 experiences a VGS of −Vtn−Vneg (in absolute values |VNEG|−|Vtn| where Vtn can be as high as 1V and operates in conflict with PMOS 116 as explained previously. This results in a large switching time and as a result a large amount of short circuit current flows for a relatively long duration of time between supplies VDD and VNEG.

2 Poor Performance at Lower Value of VDD:

At lower values of VDD, the pull up path becomes weak as compared to the pull down path owing to reduced gate-source voltages of the upper PMOS transistors and hence the performance of the level shifter circuit 100 deteriorates.

3 Not a Very Robust Design:

The design of the level shifter circuit 100 is not robust owing to 3 factors:

a) There is a conflict between the NMOS transistor 120 and the PMOS transistor 116 during switching.

b) For the case when IN=1, the N-well of the PMOS transistor 106 floats while when IN=0, the N-well of PMOS transistor 108 floats. These floating N-wells in the vicinity of negative voltages can turn-on the parasitic diode of corresponding PMOS transistors resulting in unreliable behavior (latch-up).

c) This implementation is prone to metastability owing to transiently floating nodes connected to cross-coupled transistor structures 114 with 116 and 118 with 120. Consider the transition of the level shifter from low voltage operation (when VNEG=0) to high voltage operation (when VNEG goes negative). During low voltage operation, IN=1 (say), hence OUTH=VDD and since VNEG=0, nodes OUTHN, OUTN and OUT are floating. As the level shifter circuit 100 enters in high voltage operation and VNEG goes sufficiently negative, the node OUTHN and the node OUTN discharged to VNEG and the node OUT charged to voltage zero. However, if due to mismatch in the node OUT and the node OUTN (if the node OUT is a lighter node as compared to the node OUTN), when VNEG is going negative, node OUT momentarily becomes more negative than the OUTN. In this situation, on one hand the NMOS transistor 112 tries to charge the OUT and increase its voltage level while on the other hand PMOS transistor 114 (which is ON since OUT is negative) tries to force zero on the node OUTN preventing it from going negative thereby switching on NMOS transistor 120 which tries to force negative voltage on the node OUT. This situation could result in a loop, where there is static consumption between VDD and VNEG as transistors 104, 108, 112 and 120 are all ON and could result in all the output nodes sitting at intermediate voltages for a long time, leading to metastability.

Hence, the negative level shifter 100 has a large switching time, poor performance at lower values of VDD, and is not a very robust design owing to the presence of floating nodes and its being prone to metastability.

FIG. 2 illustrates the circuit diagram of a conventional field breakdown free negative level shifting circuit 200 as described in U.S. Pat. No. 6,483,366, the disclosure of which is hereby incorporated by reference. The field breakdown free negative level shifting circuit 200 is divided into a first stage circuit 202 and a second stage circuit 204. The first stage circuit 202 includes a first voltage distributor 206 and a first driver 208. The second stage circuit 204 includes a second voltage distributor 210 and a second driver 212. The circuit 200 provides voltage switching between VDD and VNEG, where the VDD is a positive supply voltage and the VNEG is a negative voltage. The circuit 200 needs an intermediate voltage V1 between the VDD and the VNEG. The intermediate voltage V1 is selected such that no transistor is stressed. The first stage circuit 202 is switching between VDD and V1 and the second stage circuit 204 is switching between zero (GND) and VNEG. The output of the first stage circuit 202 serves as input for the second stage circuit 204. The limitation with this circuit 200 is that the intermediate voltage V1 needs to be generated and managed, and additionally there is no output node switching directly between VDD and VNEG.

FIG. 3 illustrates a circuit diagram of a conventional positive level shifter. The positive level shifter 300 shifts logic level signals to generate corresponding positive voltage signals. The positive level shifter 300 includes a plurality of NMOS transistors 302, 304, 306, 308, a plurality of PMOS transistors 310, 312, 314, 316, and cross coupled PMOS transistors 318, 320. The positive level shifter 300 receives a logic level input signal IN for which logic '1' corresponds to VDD and logic '0' corresponds to zero. The positive level shifter 300 generates four output signals at nodes OUTH, OUTHN, OUT and OUTN. Among these, the output signals at the nodes OUTH and OUTHN are switching between VPOS and GND whereas the output signals at the nodes OUT and OUTN are switching between VPOS and CASC+Vtp. The voltage CASC is a cascode voltage (whose value is between VPOS and zero) so chosen to prevent any transistor from getting stressed. Output voltages at the output nodes OUT, OUTN, OUTH and OUTHN for different values of the logic level input signal IN are summarized in TABLE 2.

TABLE 2

| INPUT | OUTPUT | | | |
|---|---|---|---|---|
| IN | OUT | OUTN | OUTH | OUTHN |
| 1 | VPOS | CASC + Vtp | VPOS | 0 |
| 0 | CASC + Vtp | VPOS | 0 | VPOS |

To understand the switching of the positive level shifter circuit 300, consider an initial state at time t=0, where the input signal IN=1 (VDD), OUTH=VPOS, OUT=VPOS, OUTHN=0 and OUTN=CASC+Vtp. Now, as the first input signal IN is switched from 1 to 0 and the second input signal IN_N is switched from 0 to 1, the NMOS transistor 304 is switched ON, resulting in discharging of the second output node OUTH (initially charged to VPOS) to zero and subsequently discharging of the fourth output node OUT (initially charged to VPOS) to a voltage CASC+Vtp through PMOS transistor 312. At this time, PMOS transistor 318 experiencing the source-gate voltage Vsg of VPOS−(CASC+Vtp), is charging third output node OUTN to VPOS and subsequently the first output node OUTHN is charged to VPOS through transistor 310. The voltage level at the fourth output node OUT (and OUTN for IN=1) can vary between CASC+Vtp and CASC−Vtp. This results in unreliable operation. Transistors 314 and 316, acting as diodes, are used for not allowing the voltage level to fall below CASC−Vtp and alleviate this problem to a certain extent; however this does not provide fail safe operation.

The limitations of the conventional architecture described above define the need for a level shifting circuit that provides improved switching speed and is fail-safe while over a wide range of supply voltage.

SUMMARY OF THE INVENTION

A voltage level shifter comprises: a cascode switching module; and at least one speed enhancer module coupled to a node of said cascode switching module, said speed enhancer module acting to enable or enhance the charging or discharging of said node during switching operations.

In an embodiment, a system includes a memory module wherein said memory module comprises: a storage array; and read and write logic incorporating at least one voltage level shifter comprising: a cascode switching module 402; and at least one speed enhancer module 404 coupled to a node of said cascode switching module, said speed enhancer module acting to enable or enhance the charging or discharging of said node during switching operations.

A memory module comprises a storage array; and read and write logic incorporating at least one voltage level shifter comprising a cascode switching module 402; and at least one speed enhancer module 404 coupled to a node of said cascode switching module, said speed enhancer module acting to enable or enhance the charging or discharging of said node during switching operations.

A method for level-shifting a voltage signal comprises: cascoding a set of controlled switches; and enhancing the speed of said cascoded controlled switches by enabling or enhancing the charging or discharging of selected nodes of said cascoded switches during switching operations.

BRIEF DESCRIPTION OF THE DRAWINGS

The aforementioned aspects and other features of the present invention will be explained in the following description, taken in conjunction with the accompanying drawings, wherein.

DETAILED DESCRIPTION OF THE DRAWINGS

Figure 1:
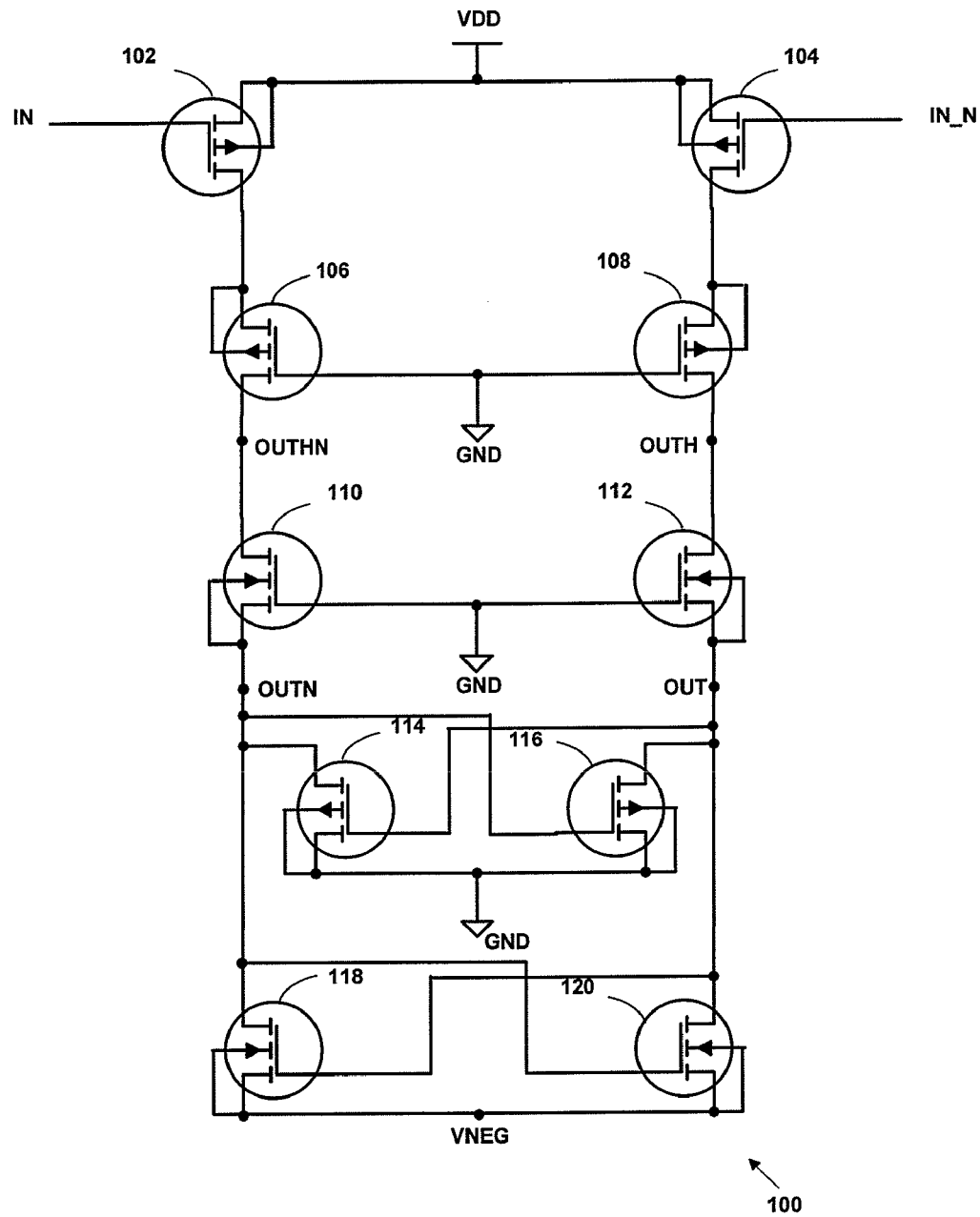
FIG. 1 illustrates a circuit diagram of a conventional negative level shifter.

The embodiments of the present invention will be described in detail with reference to the accompanying drawings. However, the present invention is not limited to these embodiments. The present invention can be modified in various forms. The embodiments of the present invention described herein are only provided to explain more clearly the present invention to the ordinarily skilled in the art of the present invention. In the accompanying drawings, like reference numerals are used to indicate like components.

Figure 2:
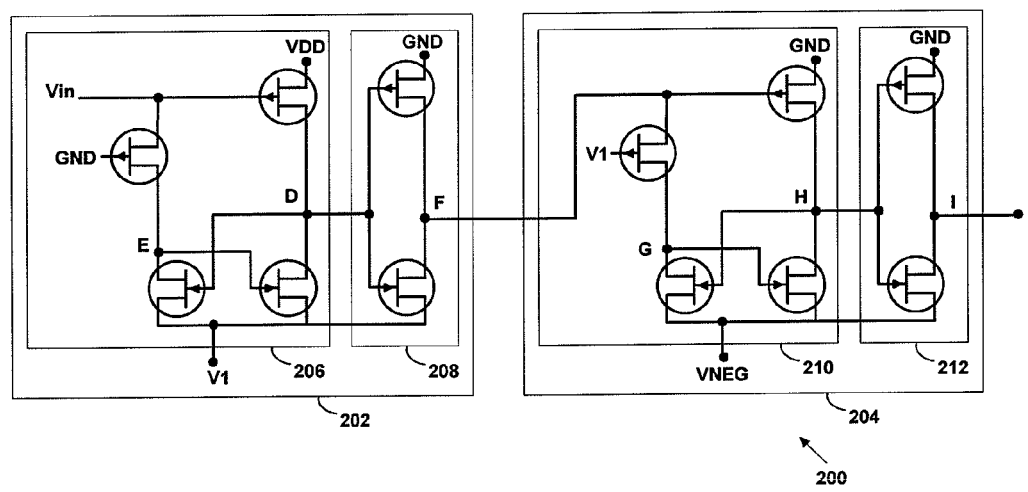
FIG. 2 illustrates a circuit diagram of a conventional field breakdown free negative level shifter.
Figure 3:
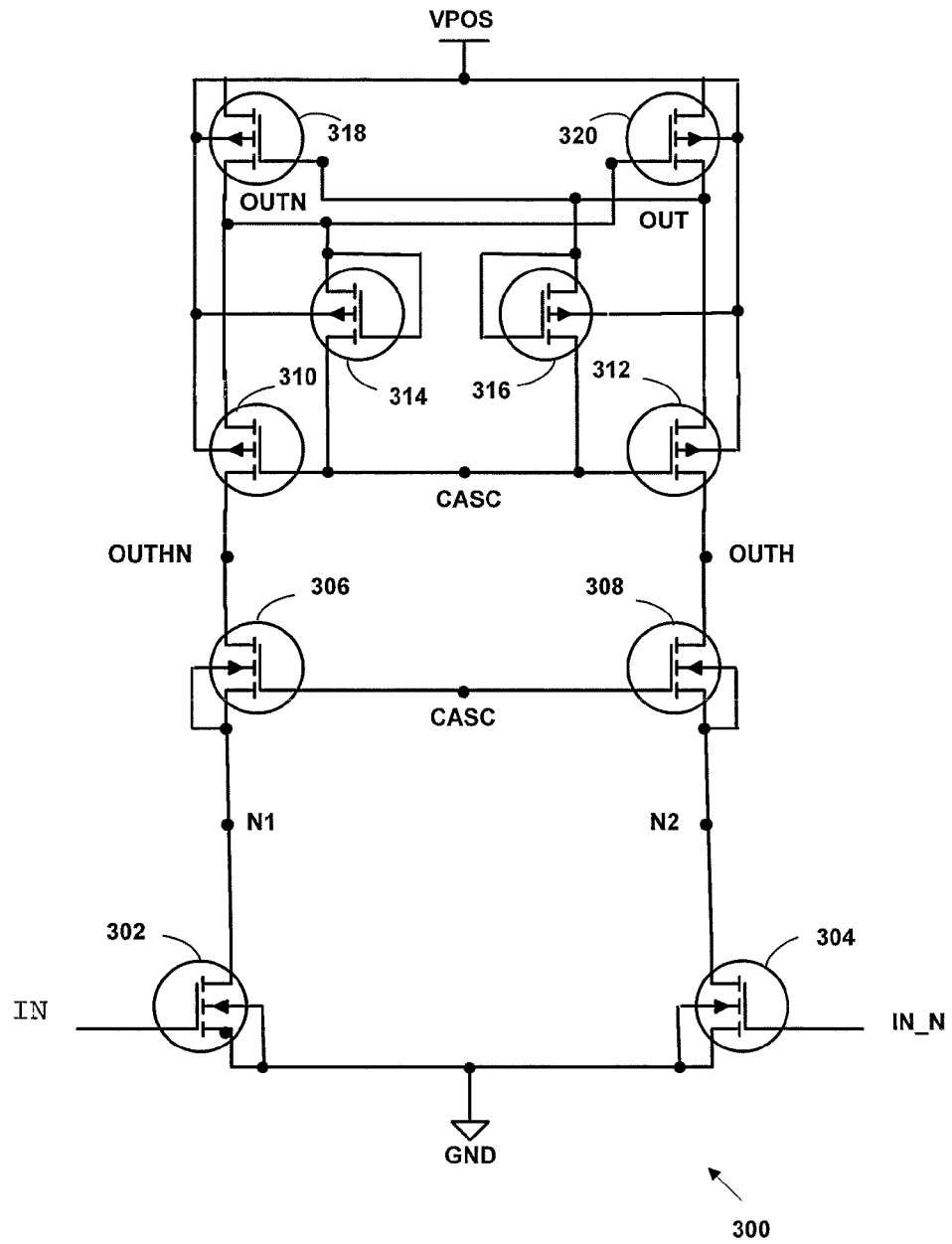
FIG. 3 illustrates a circuit diagram of a conventional positive level shifter.

FIG. 1, FIG. 2 and FIG. 3 illustrating the conventional level shifter have already been explained in the background section.

Figure 4:
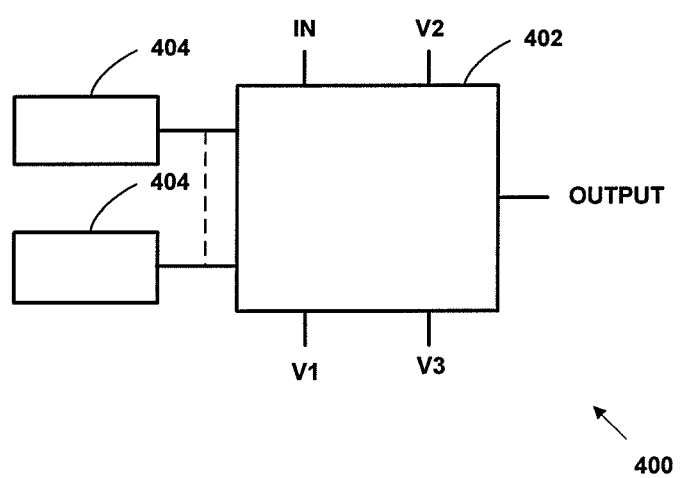
FIG. 4 illustrates a block diagram of a fail-safe high speed level shifter.

FIG. 4 illustrates a block diagram of a fail-safe high speed level shifter 400. The level shifter 400 includes a cascode module 402 and one or more speed enhancer modules 404. Each speed enhancer module 404 individually couples a selected node of the cascode module 402 to a defined voltage level V1 (V1 is the cascode voltage whose value lies between V2 and V3 and is selected to prevent any transistor from being stressed) so as to speed up the charging or discharging of such nodes and to eliminate the floating conditions. The speed enhancer modules also act to prevent metastability conditions and to speed-up the switching operations.

Figure 5:
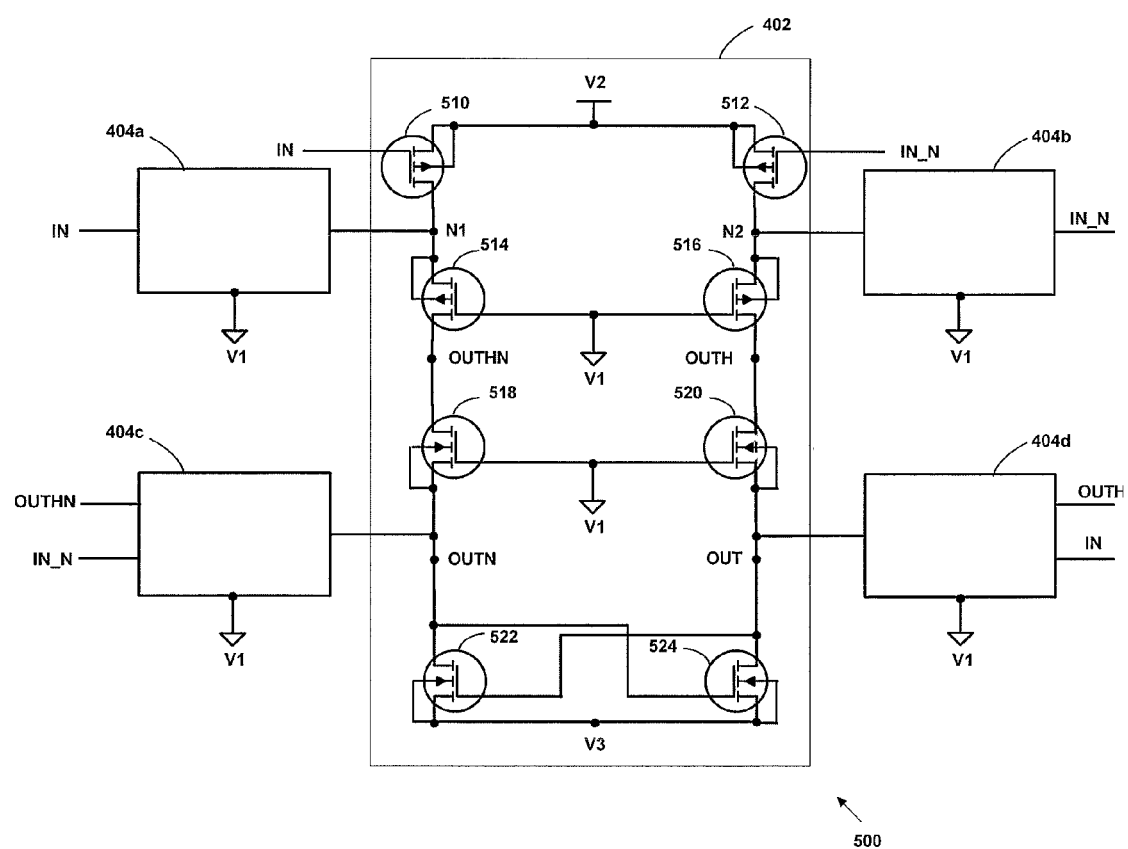
FIG. 5 illustrates a block diagram of a fail-safe high speed negative level shifter.

FIG. 5 illustrates a block diagram of a fail-safe high speed negative level shifter 500. The level shifter 500 includes a cascode module 402, and four speed enhancer modules 404. The cascode module 402 includes a first transistor 510 coupled between voltage level V2 and a first node N1. Transistor 510 receives a first input logic signal IN through its gate terminal. A second transistor 512 couples the voltage V2 to a second node N2. Transistor 512 receives a second input logic signal IN_N which is complementary to said first input logic signal IN at its gate terminal. A third transistor 514 couples the first node N1 to a first output node OUTHN. Transistor 514 receives voltage V1 at its gate terminal. A fourth transistor 516 couples the node N2 to a second output node OUTH. Transistor 516 receives voltage V1 through at its gate terminal. A fifth transistor 518 is couples the first output node OUTHN to a third output node OUTN. Transistor 518 receives voltage V1 at its gate terminal. A sixth transistor 520 couples the second output node OUTH to a fourth output node OUT. Transistor 520 receives voltage V1 at its gate terminal. A seventh transistor 522 couples third output node OUTN to a third voltage V3. The gate terminal of transistor 522 is coupled to the fourth output node OUT. An eighth transistor 524 couples the fourth output node OUT to voltage V3. The gate terminal of transistor 524 is coupled to the third output node OUTN.

A first speed enhancer module 404a is coupled between first node N1 and voltage level V1. The speed enhancer module 404a is enabled by control signal IN whenever node N1 is not driven by transistor 510 so that N1 is driven to voltage V1 in such a situation instead of being left floating. The speed enhancer module 404b is enabled by control signal IN_N whenever node N2 is not driven by transistor 512 so that N2 is driven to voltage V1 in such a situation instead of being left floating. The speed enhancer module 404c is enabled by control signals OUTHN and IN_N whenever node OUTN is not driven by transistor 522 so that OUTN is driven to voltage V1 in such a situation instead of being left floating. The speed enhancer module 404d is enabled by control signals OUTH and IN whenever node OUT is not driven by transistor 524 so that OUT is driven to voltage V1 in such a situation instead of being left floating.

Figure 6:
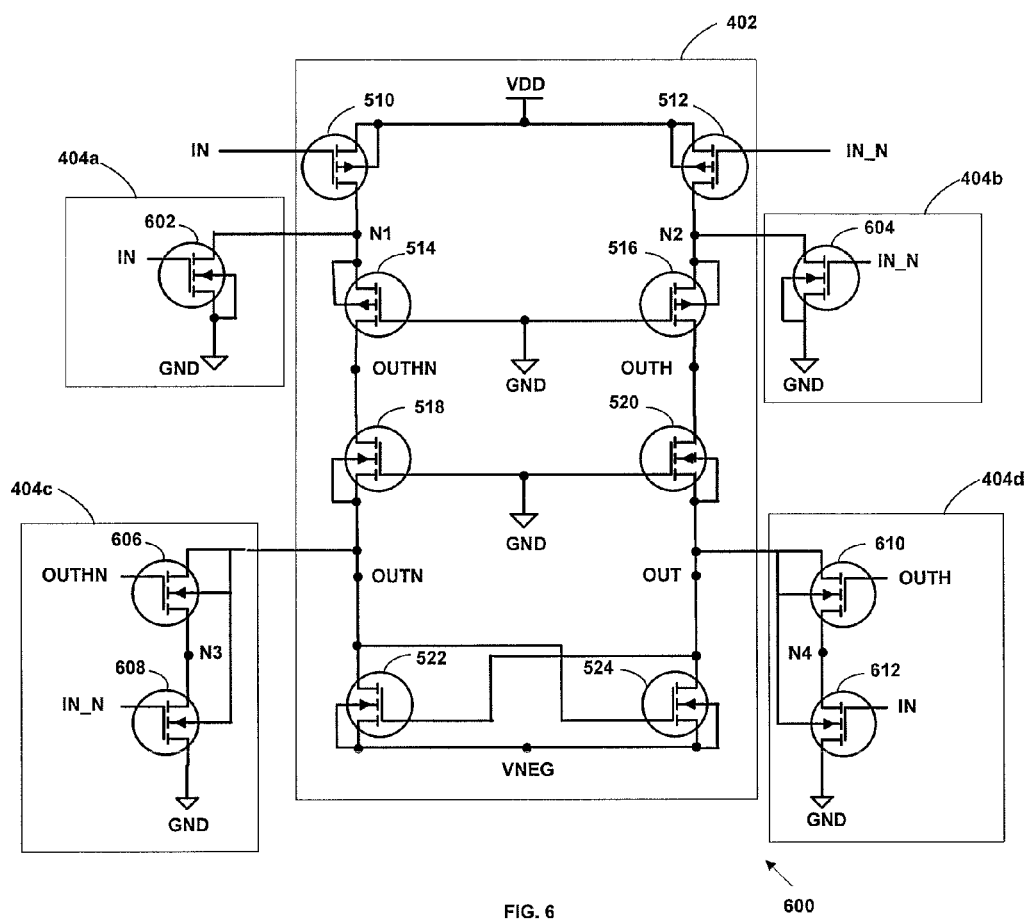
FIG. 6 illustrates a circuit diagram of a fail-safe high speed negative level shifter.

FIG. 6 illustrates the circuit diagram of one implementation of the embodiment 500 shown in FIG. 5. The first speed enhancer module 404a comprises transistor 602, which couples first node N1 with the first voltage GND under control of the first input logic signal IN at its gate terminal. The second speed enhancer module 404b comprises transistor 604 which couples the second node N2 with the first voltage GND under the control of the second input logic signal IN_N at its gate terminal. Therefore, speed enhancer 404a and 404b when enabled, facilitates the discharging of output nodes OUTHN and OUTN respectively. The third speed enhancer module 404c comprises transistor 606 and transistor 608. Transistor 606 couples the third output node OUTN with a third node N3 when enabled by the first output node OUTHN. Transistor 608 couples the third node N3 with the first voltage GND under the control of the second input logic signal IN_N at its gate terminal. Therefore speed enhancer 404c when enabled, charges the node OUTN to GND. The fourth speed enhancer module 404d comprises transistor 610 and transistor 612. Transistor 610 couples the fourth output node OUT with fourth node N4 when enabled by the second output node OUTH. Transistor 612 couples the fourth node N4 with the first voltage GND under the control of the first input logic signal IN at its gate terminal. Thus each speed enhancer module couples its corresponding node with first voltage GND and eliminates the floating condition.

The charging and discharging action of speed enhancers are explained subsequently. Also only one pair of speed enhancers (one charging and one discharging) are switched on at one time depending on the state of logic level input signal IN.

When IN=VDD (logic 1), speed enhancers 404a and 404d are switched on

When IN=GND (logic 0), speed enhancers 404b and 404c are switched on

The terms "gate terminal" and "control terminal" are used interchangeably in the description. In one embodiment, the transiently floating nodes are N1, N2, OUTN, and OUT. In an embodiment, the first voltage V1 is the ground voltage GND, the second voltage V2 is the supply voltage VDD and the third voltage V3 is the negative voltage VNEG.

Voltage levels of the four output signals at the output nodes OUT, OUTN, OUTH and OUTHN for different values of the logic level input signal IN are summarized in TABLE 3

TABLE 3

| INPUT | OUTPUT | | | |
| --- | --- | --- | --- | --- |
| IN | OUT | OUTN | OUTH | OUTHN |
| 1 | 0 | VNEG | VDD | VNEG |
| 0 | VNEG | 0 | VNEG | VDD |

To understand the switching operation of level shifter consider an initial state at time t=0, where the input signal IN=1 (VDD), OUTH=VDD, OUT=0, OUTHN=VNEG and OUTN=VNEG. The input signal IN of negative level shifter is switching between VDD (logic '1') and GND (logic '0'). As the first input logic signal IN is switched from 1 to 0, the PMOS transistor 412 is switched ON, resulting in charging of the first output node OUTHN from VNEG to the supply voltage VDD. At the same time, the second node N2 is discharged to zero as the second input logic signal IN_N is provided at the gate terminal of transistor 604. The gate terminal of transistor 606 is receiving the supply voltage VDD through the first output node OUTHN and the gate terminal of the transistor 608 is receiving the second input logic signal IN_N, where IN_N=1. The third output node OUTN is charged to zero from VNEG voltage because the transistors 606 and 608 provide a conductive path from the ground voltage GND. Transistor 524 is experiencing a Vgs voltage equal to the 0–VNEG (as OUTN=0) and hence charges the fourth output node OUT to the VNEG and subsequently charges the second output node OUTH to VNEG through transistor 520 as illustrated in TABLE 3. The circuit 600 is provided with transistors 608 and 612 to avoid any contention during switching between transistor 524 and transistor 610.

Advantages:

1 High Speed (Faster Switching)

In the design of negative level shifter explained above, due to presence of speed enhancer module 404c (404d) that charges the node OUTN (OUT) to zero, at the time of switching the NMOS trying to charge node OUT (OUTN) to VNEG experiences a VGS of 0–VNEG (absolute value of |VNEG|) as against VGS of –Vtn–VNEG experienced by NMOS in level shifter 100 and hence results in faster discharging of node OUT (OUTN) to VNEG (it was initially charged to zero). In addition to this the speed enhancer module 404b (404a), discharges the node OUTH(OUTHN) to Vtp (from its initial value of VDD) which is then eventually discharged to VNEG thereby further reducing the switching time of level shifter On account of these two reasons, the switching speed of this level shifter is high as compared to that of negative level shifter 100.

2 Good Performance for Lower Value of VDD

The architecture of negative level shifter comprises two pull up paths, the first one comprising PMOS 510 and 514 that discharges node OUTN to Vtp and the second one comprising speed enhancer module 404c (or 404d) that discharges the node OUTN to zero. Since both these pull up path are working simultaneously at the time of switching, the level shifter has good performance at even low values of VDD and hence its operational for wide range of VDD.

3 Robust Design

In this design due to presence of speed enhancer module 404a and 404b, there are no floating Nwell. In addition to this, there is no contention between transistors at the time of switching due to addition of transistors 608 and 612 in speed enhancer modules 404c and 404d respectively. Further this architecture is prone to metastability due to addition of speed enhancer modules 404c and 404d. Let us consider that during low voltage operation (when V3=0), the first input logic signal IN is switched to 1 thereby driving the second output node OUTH to the supply voltage VDD and the fourth output node OUT is driven to zero through the charging path consisting of the transistors 610 and 612. Since V3=0, the first output node OUTHN and the third output node OUTN are in a floating state. Now as the circuit 600 enters the high voltage operation by driving the voltage at V3 to the negative voltage VNEG, even if there is mismatch in nodes OUT and OUTN (if the node OUT is a lighter node as compared to the node OUTN), the fourth output node OUT is strongly driven to zero due to speed enhancer module 404d (unlike in the conventional level shifter circuit 100 where the fourth output node OUT was floating) which ensures that the third output node OUTN and the first output node OUTHN are discharged to the VNEG through the transistor 522. Hence the output nodes OUTH, OUT, OUTHN and OUTN achieve there desired values as illustrated in TABLE 3 and there is no risk of the level shifter 600 entering into a metastable state or any static path being formed between the supplies.

Figure 7:
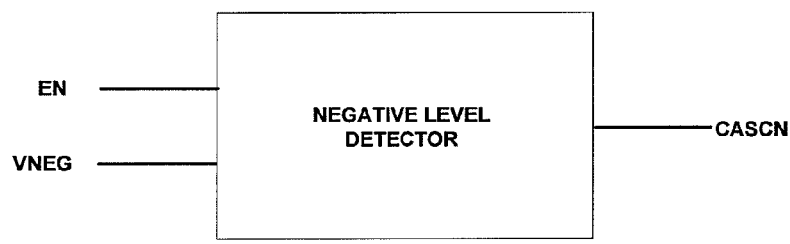
FIG. 7 illustrates a block diagram of a negative level detector.

Hence, the fail-safe high speed level shifter 600 provides a robust architecture having no contention, no N-well floating, and no issues of metastability and it operates for wide range of Vdd FIG. 7 illustrates a block diagram of a negative level detector. The negative level detector receives the negative voltage VNEG and an enable signal EN. The negative level detector senses the voltage level of the VNEG and based on that generates an output voltage CASCN.

Figure 8:
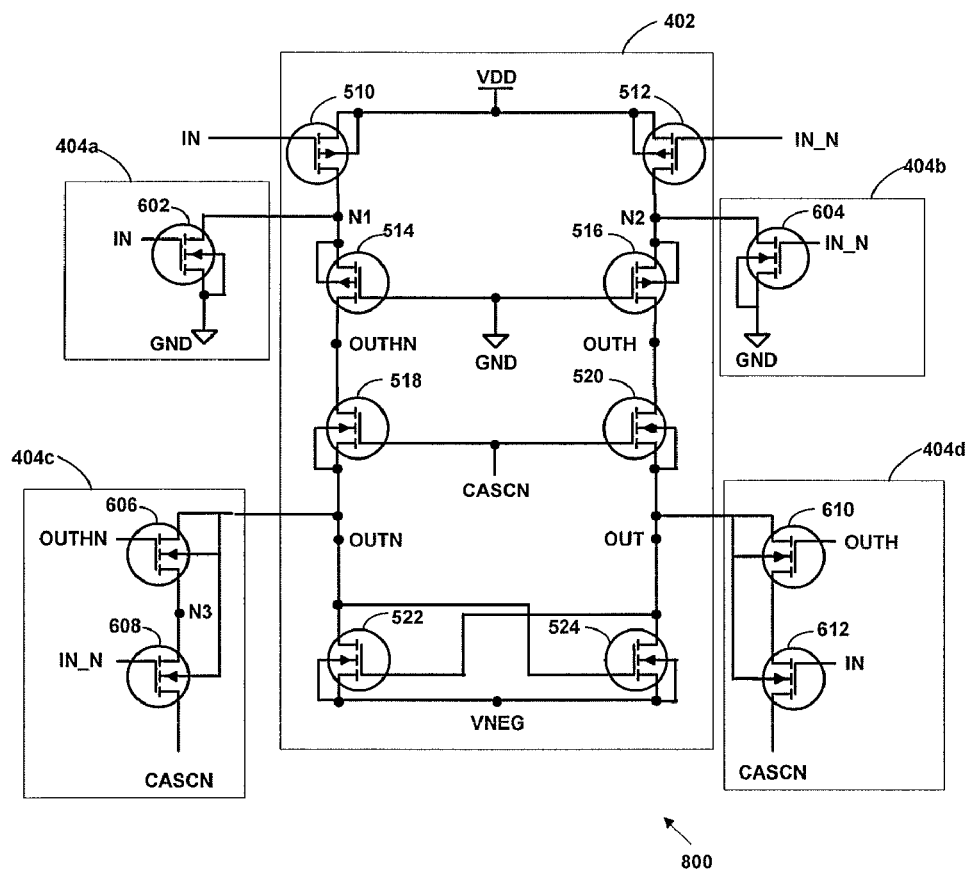
FIG. 8 illustrates a circuit diagram of a fail-safe high speed positive level shifter.

FIG. 8 illustrates a circuit diagram of a fail-safe high speed negative level shifter 800. The level shifter 800 includes a cascode module 402, a first speed enhancer module 404a, a second speed enhancer module 404b, a third speed enhancer module 404c, and a fourth speed enhancer module 404d. The gate terminal of transistor 518 and the gate terminal of transistor 520 are coupled to the CASCN voltage. Transistor 608 of the third speed enhancer module 404c couples the third node N3 with the CASCN voltage. Transistor 612 of the fourth speed enhancer module 404d couples the fourth node N4 with the CASCN voltage. The connections of the other transistors are similar to the connections illustrated in FIG. 6. The CASCN voltage is an output of the negative level detector. During high voltage operation, VNEG is more negative than a trigger voltage Vtrg and the CASCN voltage is zero. Thus, the level shifter 800 is similar to the level shifter 600 as illustrated in FIG. 6.

During low voltage operation, VNEG is greater than the trigger voltage Vtrg and the CASCN voltage is VDD. The trigger voltage Vtrg is an adequate negative voltage at which the detector switches its output CASCN and the value of Vtrg is governed by safe operating area (SOA) limits of NMOS transistors used in the design. Table 4 defines the logic Truth Table for this mode of operation

TABLE 4

| INPUT | OUTPUT | | | |
|---|---|---|---|---|
| IN | OUT | OUTN | OUTH | OUTHN |
| 1 | VDD – Vtn | VNEG | VDD | VNEG |
| 0 | VNEG | VDD – Vtn | VNEG | VDD |

At an initial state at time t=0, where the input signal IN=1 (VDD), OUTH=VDD, OUT=0, OUTHN=VNEG and OUTN=VNEG. As the input logic signal IN is switched from 1 to 0, PMOS transistor 510 is switched ON, resulting in charging of the first output node OUTHN from VNEG to the supply voltage VDD. At the same time, the second node N2 is discharged to zero as the second input logic signal IN_N is provided at the gate terminal of the transistor 604 for providing conducting path to the ground voltage. The gate terminal of the transistor 606 is receiving the supply voltage VDD through the first output node OUTHN and the gate terminal of the transistor 608 is receiving the second input logic signal IN_N, where IN_N=1. The third output node OUTN is charged to VDD–Vtn from VNEG voltage because the transistors 606 and 608 provide a conductive path from the supply voltage VDD, (CASCN). Transistor 524 drives the fourth output node OUT to VNEG and subsequently charges second output node OUTH to VNEG as illustrated in TABLE 4.

For high voltage conditions, the operation of the circuit is identical to the functioning of the circuit described in FIG. 6. The voltage levels at the output nodes of the negative level shifter under these conditions are summarized in Table-3.

Figure 9:
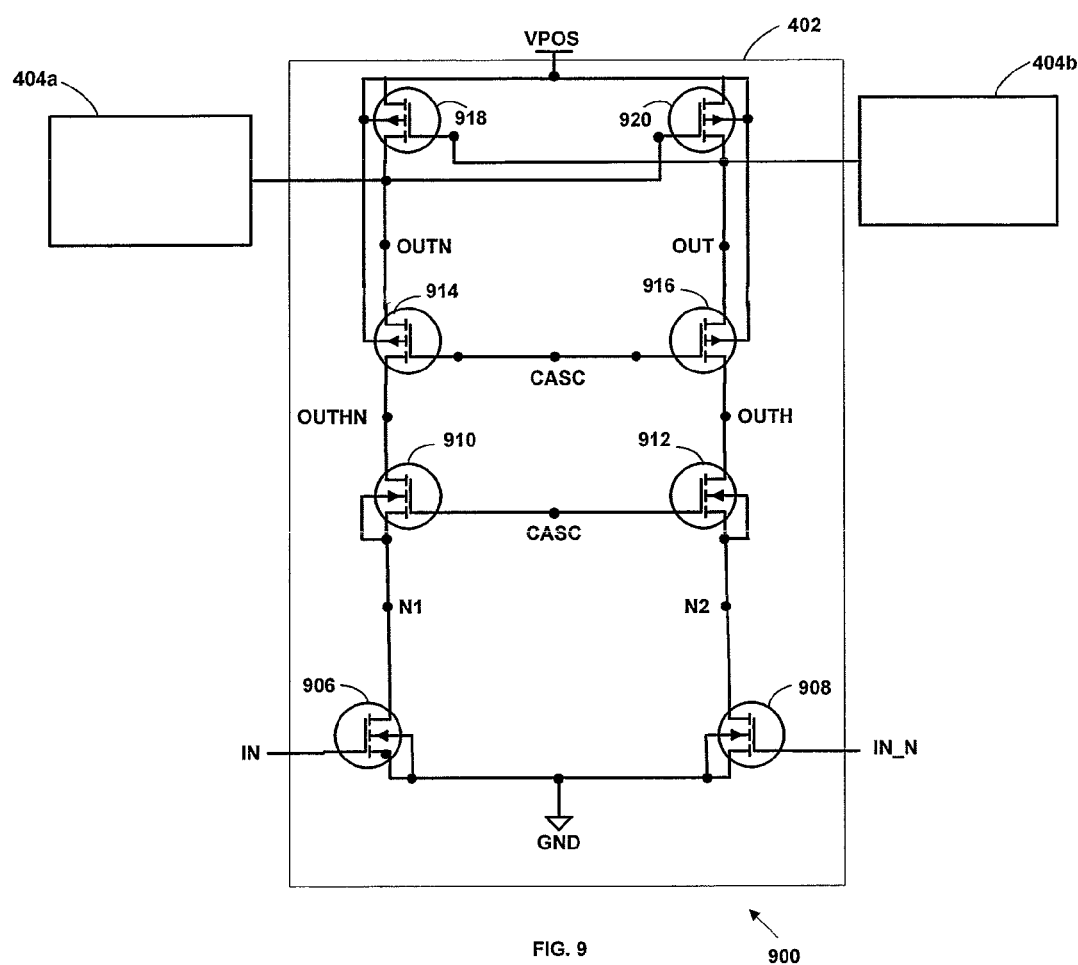
FIG. 9 illustrates a block diagram of a fail-safe high speed positive level shifter.

FIG. 9 illustrates a block diagram of a fail-safe high speed positive level shifter 900. The level shifter 900 includes a cascode module 402, a first speed enhancer module 404a, and a second speed enhancer module 404b. The cascode module 402 includes a plurality of NMOS transistors 906, 908, 910, 912, and a plurality of PMOS transistors 914, 916, 918, 920. NMOS transistor 906 couples the ground voltage GND with a first node N1 on receiving a first input logic signal IN at its gate terminal for discharging first node N1. NMOS transistor 908 couples the ground voltage GND with a second node N2 on receiving a second input logic signal IN_N at its gate terminal for discharging second node N2. NMOS transistor 910 couples the first node N1 with a first output node OUTHN on receiving a CASC voltage at its gate terminal. NMOS transistor 912 couples the second node N2 with a second output node OUTH on receiving the CASC voltage at its gate terminal. PMOS transistor 914 couples the first output node OUTHN with a third output node OUTN on receiving the CASC voltage at its gate terminal. PMOS transistor 916 couples the second output node OUTH with a fourth output node OUT on receiving the CASC voltage at its gate terminal. PMOS transistor 918 couples the third output node OUTN with a positive voltage VPOS under the control of the fourth output node OUT through its gate terminal. PMOS transistor 920 couples the fourth output node OUT with the positive voltage VPOS under the control of the third output node OUTN at its gate terminal. The CASC voltage is an intermediate voltage (between VPOS and GND) selected so to prevent the transistors from being stressed. In the embodiment, the CASC voltage is equal to the supply voltage VDD.

The first speed enhancer module 404a coupled to the cascode module 402 through the third output node OUTN for reducing the discharging time of the third output node OUTN. The second speed enhancer module 404b is coupled to the cascode module 402 through the fourth output node OUT for reducing the discharging time of the fourth output node OUT.

Figure 10:
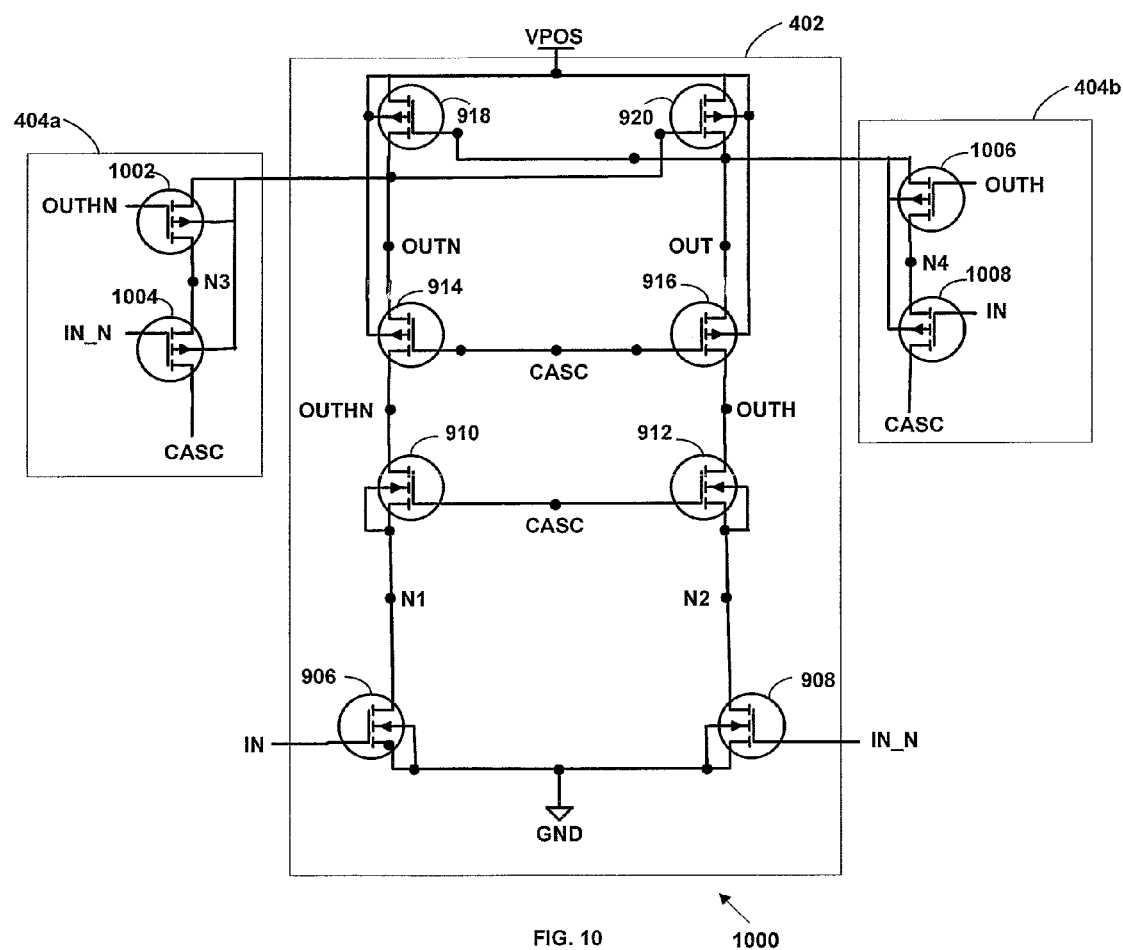
FIG. 10 illustrates a circuit diagram of a fail-safe high speed positive level shifter.

FIG. 10 illustrates the circuit diagram of one implementation of the embodiment 900 shown in FIG. 9. The level shifter 1000 includes a cascode module 402, a first speed enhancer module 404a, and a second speed enhancer module 404b. The first speed enhancer module 404a comprises PMOS transistor 1002 and PMOS transistor 1004. PMOS transistor 1002 couples the third output node OUTN with a third node N3 for discharging the third output node OUTN on receiving the zero voltage at its gate terminal from the first output node OUTHN. PMOS transistor 1004 couples the third node N3 with the CASC voltage on receiving the second input logic signal IN_N at its gate terminal. The second speed enhancer module 404b comprises PMOS transistor 1006 and PMOS transistor 1008. PMOS transistor 1006 couples the fourth output node OUT with a fourth node N4 for discharging the fourth output node OUT under control of the second output node OUTH. The PMOS transistor 1008 couples the fourth node N4 with the CASC voltage on receiving the first input logic signal IN at its gate terminal.

TABLE 5

| INPUT | OUTPUT | | | |
|---|---|---|---|---|
| IN | OUT | OUTN | OUTH | OUTHN |
| 1 | VPOS | CASC | VPOS | 0 |
| 0 | CASC | VPOS | 0 | VPOS |

In an embodiment of the present invention, consider an initial state at time t=0, where the input signal IN=1 (VDD), OUTH=VPOS, OUT=VPOS, OUTHN=0 and OUTN=CASC. Now as the first input logic signal IN is switched from 1 to 0, thereby, discharging the second output node OUTH to zero from the VPOS. This switches on the transistors 1006 and 1008 and discharges the fourth output node OUT to the CASC voltage. Then the transistor 918 experiences a source-gate voltage Vsg of VPOS−CASC and charges the third output node OUTN to the VPOS and subsequently the first output node OUTHN is also charged to the VPOS through the transistor 914. Hence the output nodes OUTH, OUT, OUTHN and OUTN achieve there desired values as illustrated in TABLE 5. During switching, the transistor 918 experiences the source-gate voltage Vsg of VPOS−CASC and hence result in faster switching as compared with the conventional level shifter 300 where the PMOS transistor 318 experiencing the source-gate voltage Vsg of VPOS−(CASC+Vtp). Switching time is also reduced because the fourth output node OUT, which discharges simultaneously through a first path formed by the transistors 1006 and 1008 and a second path formed by transistor 916. Thus, in this embodiment speed gain is at least 50%. In this embodiment, the node OUT (and OUTN for IN=1) are strongly driven to CASC voltage through a discharging path formed by the transistors 1006, 1008 (and the transistors 1002, 1004).

If VDD>=CASC, the transistors 1004 and 1008 is controlled by the second input logic signal IN_N and the first input logic signal IN, respectively. If VDD<CASC and IN=0, a gate terminal of the transistor 1004 is provided with the CASC voltage, and a gate terminal of the transistor 1008 is provided with the zero voltage to control the transistors 1004 and 1008 respectively. If VDD<CASC and IN=1, the gate terminal of the transistor 1008 is provided with the CASC voltage and the gate terminal of the transistor 1004 is provided with the zero voltage to control the transistors 1008 and 1004 respectively. Thus, when the VDD<CASC, the voltage provided at the gate terminal of the transistors 1004 and 1008 is switching between the CASC voltage and the zero voltage based on the value of input logic signal IN.

Figure 11:
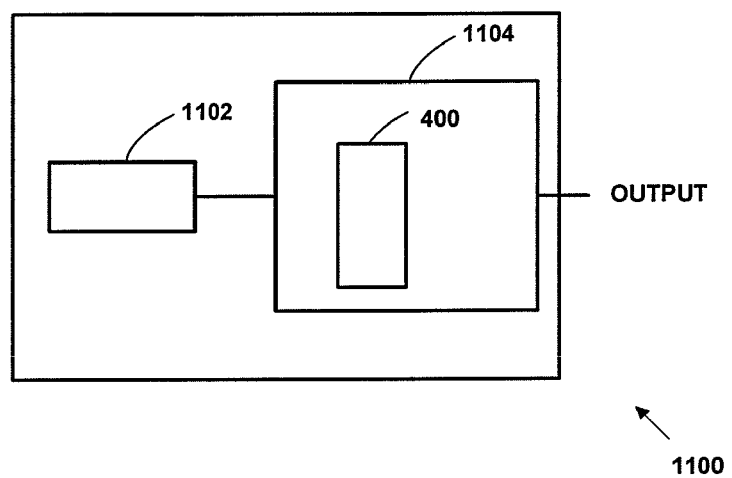
FIG. 11 illustrates a block diagram that discloses an application for the voltage level shifter.

FIG. 11 illustrates a block diagram that discloses an application for the voltage level shifter 400 according to an embodiment of the present invention used in a memory module. The memory module 1100 includes a storage array 1102 and a read and write circuit 1104. The read and write circuit 1104 incorporates at least one voltage level shifter 400. The voltage level shifter 400 includes a cascode module 402 and one or more speed enhancer modules 404.

Figure 12:
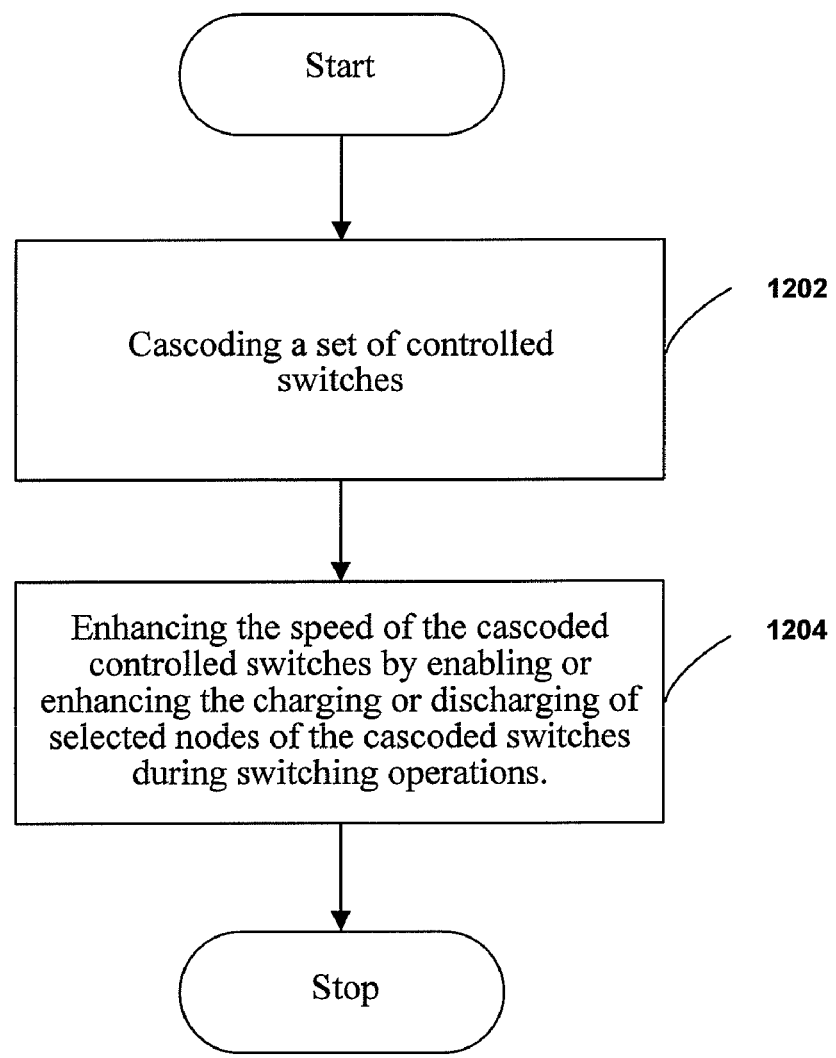
FIG. 12 illustrates a flow diagram of a method for level-shifting a voltage signal.

FIG. 12 illustrates a flow diagram of a method for level-shifting a voltage signal according to an embodiment of the present invention. At step 1102, a set of controlled switches is cascoded. At step 1104, the speed of the cascoded controlled switches are enhanced by enabling or enhancing the charging or discharging of selected nodes of said cascoded switches during switching operations.

The embodiment of the present invention is related to a level shifter and can be used in various applications that require high voltages for operation. Its use in non volatile memory is one such application.

The present invention offers several advantages. It provides a level shifter having a speed gain of about 40% while maintaining efficient operation over a wide supply voltage range It achieves this without any area overhead. The present invention also provides a robust architecture having no contention, no N-well floating, and no issues of metastability.

Although the disclosure of circuit and method has been described in connection with the embodiment of the present invention illustrated in the accompanying drawings, it is not limited thereto. It will be apparent to those skilled in the art that various substitutions, modifications and changes may be made thereto without departing from the scope and spirit of the disclosure.

We claim:

1. A circuit, comprising:
a level shifting circuit including a first conduction path formed of a plurality of transistors connected in series between a first reference voltage terminal and a second reference voltage terminal, the first conduction path including a first internal node located at a first series connection point between two of the plurality of transistors in the first conduction path, the first conduction path further including a first output node located at a second series connection point between two of the plurality of transistors in the first conduction path, said level shifting circuit configured to level shift a first input signal received at a control terminal of one of the plurality of transistors to a level shifted output signal at the first output node;
a first switching speed enhancing circuit configured to selectively couple the first internal node to a third reference voltage terminal in response to the first input signal.

2. A circuit comprising:
a level shifting circuit including a first conduction path formed of a plurality of transistors connected in series between a first reference voltage terminal and a second reference voltage terminal, the first conduction path including a first internal node and a first output node and configured to be controlled for switching operation in response to a first input signal;
a first switching speed enhancing circuit coupled between the first internal node and a third reference voltage terminal, the first speed enhancing circuit configured to selectively couple the first internal node to the third reference voltage terminal in response to the first input signal; and
a second switching speed enhancing circuit coupled between the first output node and a fourth terminal, the second switching speed enhancing circuit configured to selectively couple the first output node to the fourth terminal in response to at least a complement of the first input signal.

3. The circuit of claim 2 wherein the level shifting circuit further comprises a second conduction path formed of a plurality of transistors connected in series between the first reference voltage terminal and the second reference voltage terminal, the second conduction path including a second internal node and a second output node and configured to be controlled for switching operation in response to a second input signal which is a complement of the first input signal.

4. The circuit of claim 3 wherein the first and second conduction paths are interconnected and switch in a complementary manner.

5. The circuit of claim 3 further comprising a third switching speed enhancing circuit coupled between the second internal node and the third reference voltage terminal, the third switching speed enhancing circuit configured to selectively couple the second internal node to the third reference voltage terminal in response to the second input signal.

6. The circuit of claim 5 further comprising a fourth switching speed enhancing circuit coupled between the second output node and the fourth terminal, the fourth switching speed enhancing circuit configured to selectively couple the second output node to the fourth terminal in response to at least a complement of the second input signal.

7. A circuit comprising:
a cascode voltage level switching module comprising a series connection of the controlled conduction paths of a plurality of transistors, the series connection including an internal node between two of the plurality of transistors in said series connection; and
at least one speed enhancer module configured to selectively couple said internal node of said series connection to a reference voltage node in response to an input signal also received by the cascade voltage level switching module so as to enable or enhance at least one of a charging or discharging of said internal node during switching of the cascode voltage level switching module.

8. The circuit as claimed in claim 7, wherein said cascode voltage level switching module comprises:
a first controlled switch operatively coupling a second voltage to a first node, and receiving a first input logic signal IN at its control terminal;
a second controlled switch operatively coupling said second voltage to a second node, and receiving a complement of said first input logic signal IN at its control terminal;
a third controlled switch operatively coupling said first node to a first output node, and receiving a first voltage at its control terminal;
a fourth controlled switch operatively coupling the second node to a second output node, and receiving said first voltage at its control terminal;
a fifth controlled switch operatively coupling said first output node to a third output node, and receiving said first voltage at its control terminal;
a sixth controlled switch operatively coupling the second output node to a fourth output node, and receiving said first voltage at its control terminal;
a seventh controlled switch operatively coupling the third output node to a third voltage, and having its control terminal coupled to the fourth output node; and
an eighth controlled switch operatively coupling the fourth output node to said third voltage, and having its control terminal coupled to the third output node.

9. The circuit as claimed in claim 7, wherein said speed enhancer module comprises a single controlled switch having one main terminal coupled to the internal node, its second main terminal coupled to said reference voltage node and its control terminal coupled to an input signal node.

10. The circuit as claimed in claim 7, wherein said speed enhancer module comprises a pair of series-coupled controlled switches, a first one of the series-coupled controlled switches having its first main terminal node, its second main terminal couple to a first main terminal of a second one of the series-coupled controlled switches, a second main terminal of said second series-coupled controlled switch being coupled to said reference voltage node, a control terminal of said first series-coupled controlled switch being coupled to an input signal node and a control terminal of said second series-coupled controlled switch being coupled to an output level shifted node of the cascade cascade voltage level shifting switching module.

11. A memory module, comprising:
a storage array; and
read and write logic incorporating at least one voltage level shifter;
wherein the voltage level shifter comprises:
a cascode switching module; and
at least one speed enhancer module coupled to a node of said cascode switching module, said speed enhancer module acting to enable or enhance at least one a charging or discharging of said node during switching by the cascode switching module;

wherein said speed enhancer module comprises a single controlled switch having one main terminal coupled to the node, its second main terminal coupled to a first voltage node and its control terminal coupled to an input signal node.

12. A memory module, comprising:
a storage array; and
read and write logic incorporating at least one voltage level shifter;
wherein the voltage level shifter comprises:
a cascode switching module; and
at least one speed enhancer module coupled to a node of said cascode switching module, said speed enhancer module acting to enable or enhance at least one a charging or discharging of said node during switching by the cascode switching module;
wherein said speed enhancer module comprises a pair of series-coupled controlled switches, a first one of the series-coupled controlled switches having its first main terminal coupled to the node, its second main terminal coupled to a first main terminal of a second one of the series-coupled controlled switches, a second main terminal of said second series-coupled controlled switch being coupled to a first voltage node, a control terminal of said first series-coupled controlled switch being coupled to an input signal node and a control terminal of said second series-coupled controlled switch being coupled to an output level shifted node of the cascade voltage level shifting module.

13. A circuit, comprising:
a first plurality of first MOS transistors having source-drain paths connected in series between a first voltage reference node and a second voltage reference node, the series connection of said first MOS transistors including a first internal node and a first output node, said first MOS transistors including a first input transistor having a gate connected to receive an input signal, said first plurality of first MOS transistors configured to level shift said input signal and generate a level shifted signal at the first output node; and
a first speed enhancing MOS transistor having a source-drain path coupled between said first internal node and a third voltage reference node, said first speed enhancing MOS transistor having a gate connected to receive said input signal.

14. The circuit of claim 13, further comprising a second speed enhancing MOS transistor having a source-drain path coupled between said first output node and a fourth voltage node, said second speed enhancing MOS transistor having a gate connected to receive a complementary version of said input signal.

15. The circuit of claim 14, further comprising a third speed enhancing MOS transistor having a source-drain path coupled between said first output node and said fourth voltage node, said third speed enhancing MOS transistor having a gate connected to receive a first control signal generated at an internal node in the series connection of said first MOS transistors.

16. The circuit of claim 15 wherein the source-drain path of the second speed enhancing MOS transistor and the source-drain path of the third speed enhancing MOS transistor are coupled in series.

17. The circuit of claim 14 wherein the fourth voltage node is a fourth voltage reference node.

18. The circuit of claim 17 wherein the fourth voltage reference node is the same as the third voltage reference node.

19. The circuit of claim 14 wherein the fourth voltage node is a cascode bias voltage node coupled to a gate of one of the first MOS transistors.

20. The circuit of claim 13 further comprising:
a second plurality of second MOS transistors having source-drain paths connected in series between the first voltage reference node and the second voltage reference node, the series connection of said second MOS transistors including a second internal node and a second output node, said second MOS transistors including a second input transistor having a gate connected to receive a complementary version of said input signal, said second plurality of second MOS transistors configured to level shift said complementary input signal and generate a complementary level shifted signal at the second output node.

21. The circuit of claim 20 wherein the first plurality of first MOS transistors and the second plurality of second MOS transistors are interconnected and switch in a complementary manner.

22. The circuit of claim 20, further comprising a fourth speed enhancing MOS transistor having a source-drain path coupled between said second internal node and the third voltage reference node, said fourth speed enhancing MOS transistor having a gate connected to receive said complementary input signal.

23. The circuit of claim 22, further comprising a fifth speed enhancing MOS transistor having a source-drain path coupled between said second output node and the fourth voltage node, said fifth speed enhancing MOS transistor having a gate connected to receive said input signal.

24. The circuit of claim 23, further comprising a sixth speed enhancing MOS transistor having a source-drain path coupled between said second output node and said fourth voltage node, said sixth speed enhancing MOS transistor having a gate connected to receive a second control signal generated at an internal node in the series connection of said second MOS transistors.

25. The circuit of claim 24 wherein the source-drain path of the fifth speed enhancing MOS transistor and the source-drain path of the sixth speed enhancing MOS transistor are coupled in series.

* * * * *

UNITED STATES PATENT AND TRADEMARK OFFICE
CERTIFICATE OF CORRECTION

| | | |
|---|---|---|
| PATENT NO. | : 8,218,377 B2 | Page 1 of 1 |
| APPLICATION NO. | : 12/464749 | |
| DATED | : July 10, 2012 | |
| INVENTOR(S) | : Amit Tandon et al. | |

It is certified that error appears in the above-identified patent and that said Letters Patent is hereby corrected as shown below:

In the Claims:

At column 12, claim number 7, line number 6, please replace the word [cascade] with -- cascode --.

At column 12, claim number 10, line number 55, please replace the words [cascade cascade] with -- cascode --.

At column 13, claim number 12, line number 28, please replace the word [cascade] with -- cascode --.

Signed and Sealed this
Twenty-eighth Day of August, 2012

David J. Kappos
*Director of the United States Patent and Trademark Office*